United States Patent [19]

Jaccard

[11] 4,435,090

[45] Mar. 6, 1984

[54] STATIC PICK-UP FOR TIMEPIECE

[75] Inventor: Pierre-Ernest Jaccard, Bienne, Switzerland

[73] Assignee: Societe Suisse pour l'Industrie Horlogere Management Services S.A., Bienne, Switzerland

[21] Appl. No.: 238,291

[22] Filed: Feb. 25, 1981

[30] Foreign Application Priority Data

Mar. 7, 1980 [CH] Switzerland .................. 1796/80

[51] Int. Cl.³ .............................................. G04B 29/00
[52] U.S. Cl. ............................ 368/320; 200/DIG. 2; 340/365 C
[58] Field of Search ............... 368/320, 321, 69, 70; 200/DIG. 1, DIG. 2, 52 R; 340/365 C

[56] References Cited

U.S. PATENT DOCUMENTS

| | | | |
|---|---|---|---|
| 4,055,735 | 10/1977 | Eachus et al. | 200/DIG. 1 |
| 4,059,956 | 11/1977 | Maeda et al. | 200/DIG. 2 |
| 4,064,688 | 12/1977 | Sasaki et al. | 200/DIG. 2 |
| 4,091,610 | 5/1978 | Sasaki et al. | 200/DIG. 1 |
| 4,102,119 | 7/1978 | Tabata | 200/DIG. 1 |
| 4,203,280 | 5/1980 | Ziegler et al. | 200/DIG. 1 |
| 4,247,929 | 1/1981 | Sasaki et al. | 200/DIG. 1 |
| 4,290,052 | 9/1981 | Eichelberger et al. | 200/DIG. 1 |
| 4,304,976 | 12/1981 | Gottbreht et al. | 200/DIG. 1 |

*Primary Examiner*—Bernard Roskoski
*Attorney, Agent, or Firm*—Griffin, Branigan & Butler

[57] ABSTRACT

A static pick-up may comprise a sapphire substrate of which the upper surface bears at least two metallic electrodes and a dielectric and the lower surface is metallized in a manner to receive directly an electronic circuit adapted to detect the position of a finger placed on the pick-up. The electrodes are coupled to the lower surface metallization by means of metallized passages. The pick-up may be employed as a control means for introducing and correcting data as displayed by a timepiece.

13 Claims, 5 Drawing Figures

STATIC PICK-UP FOR TIMEPIECE

BACKGROUND OF THE INVENTION

The present invention concerns a static pick-up for a timepiece comprising at least two juxtaposed touch sensitive capacitive electrodes arranged to be manually activated and electronic means arranged and adapted to detect each position of the finger which corresponds to at least one symbol in the form of a digit, a letter or special sign.

Capacitive static pick-ups are known from the state of the art. In certain applications they may advantageously replace mechanical pushbuttons and may be found for example in control systems for lifts, in programming of sewing machines, and for controlling various functions of an electronic timepiece, such as time setting or the choice of a precise function.

In the case of utilisation of such a pick-up in timekeeping, one may readily understand the interest that this exhibits over a mechanical pushbutton which must pass through a casing in order to be accessible from the exterior and which from this fact causes problems of sealing and contamination thereby bringing about an increase in manufacturing costs and a lessening of the reliability of the control system. It must also be mentioned that the space occupied by a static pick-up may be reduced to dimensions substantially less than those of a traditional mechanical pushbutton.

In U.S. patent application Ser. No. 217,079 filed Dec. 16, 1980, the applicant has proposed a data entry device for a timepiece comprising a static pick-up formed by the juxtaposition of N electrodes providing at the output at least N-1 coded information signals representing the position of the finger on the pick-up characterized by the fact that it comprises means for generating signals representing the data which one seeks to select or to modify, means for displaying symbols on a composite display and means for detecting the sense and the speed of movement of the finger over the pick-up. If the application cited describes in detail the electronic arrangement of such a device, nothing therein relates to the practical realisation of the sensing keys and the matter by which these may be incorporated into the timepiece.

The purpose of the present invention is to propose an original design comprising the juxtaposition of at least two electrodes such as may satisfy the requirements for proper functioning of the data entry device of the cited application.

A further purpose of the invention is to provide a compact device which is readily mass produced, having reduced dimensions which incorporates not only the capacitive keys, but further the electronic circuit which assures its operation.

Still a further purpose of the invention is to realise a sensitive pick-up having a decorative aspect, watertight and especially resistant to mechanical, physical and chemical stresses which may be found in the usual environment of a wrist-watch.

These purposes may be obtained through use of the claimed means.

DETAILED DESCRIPTION OF THE DRAWINGS

Figure 1:
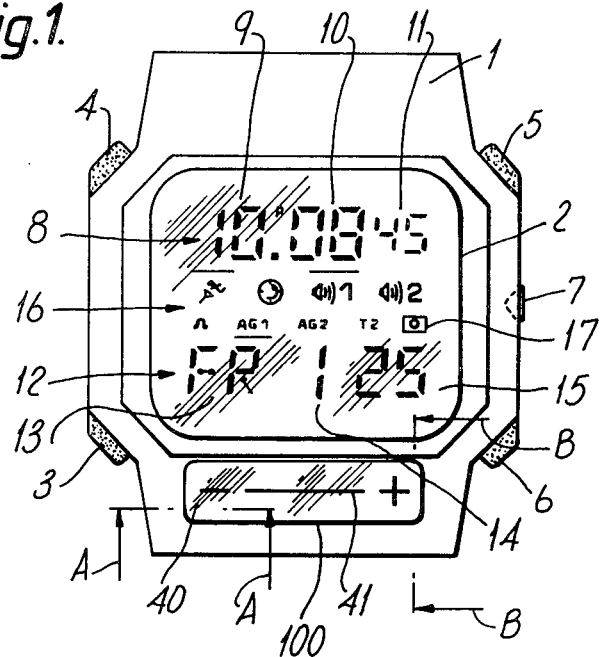
FIG. 1 is a top view of the timepiece in which the display appears as well as a static pick-up independent from the said display.

FIG. 1 is a top view of the timepiece according to the invention. It comprises case 1 in which are mounted an electronic module of which one may note the display 2, a plurality 3, 4, 5, 6 and 7 of pushbuttons and a static pick-up 100, the object of the present invention and which will be described in detail further on. The display 2, which may be formed of a liquid crystal cell, comprises, in addition to the permanent display 8 of the normal time composed of three groups of two digits displaying hours 9, minutes 10 and seconds 11, an auxiliary display 12 which may display for instance the day of the week 13, the month 14 and the date 15. Signs 16, permanently fixed as for example by transfer to the underside of the watch crystal, indicate the possible functional modes into which one may switch the auxiliary display. For instance, the sign AG 1 signifies "diary 1" and sign D the "date". The display of a framework 17 signals in which mode one is operating. The cited patent application describes in detail how, by means of pick-up 100, time setting is accomplished on the principal display, as well as selection of the functional mode and the introduction of new data into the auxiliary display.

The description that follows concerns the static pick-up 100, its composition and the process employed for its manufacture according to the invention.

Figure 2:
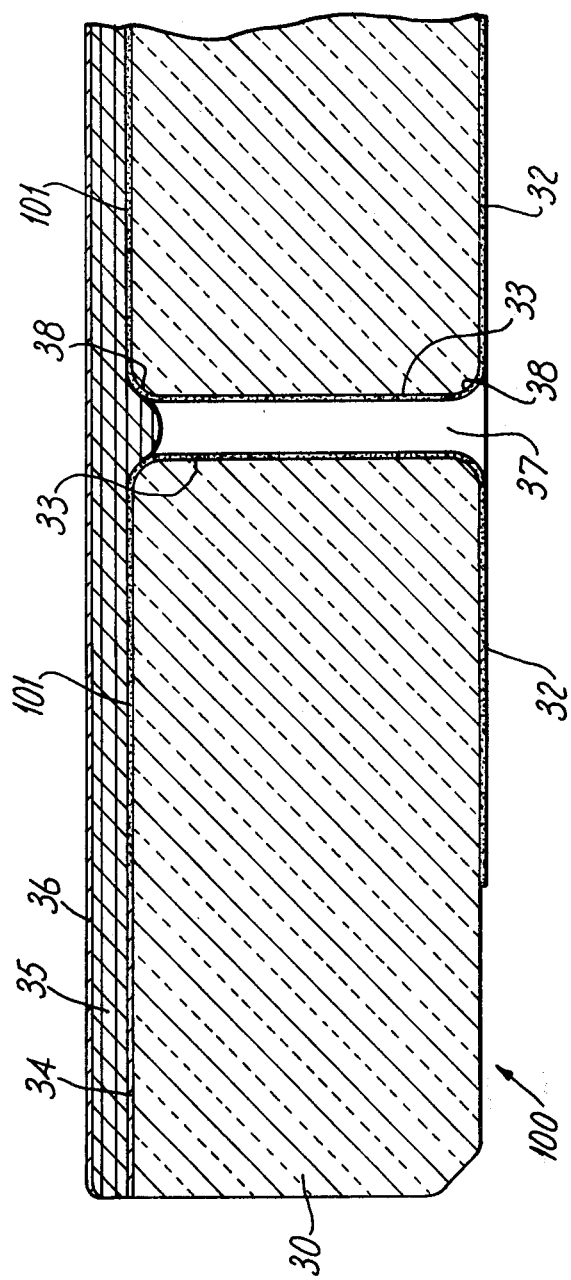
FIG. 2 is a section along line A—A through the pick-up of FIG. 1 and to an enlarged scale.

FIG. 2 is a cross-section along line A—A through the pick-up of FIG. 1 and to an enlarged scale. The pick-up 100 comprises an electrically insulating substrate 30, a first metallization 101, a second metallization 32, coupling means 33 between the first and second metallizations, an electrically insulating compensation layer 34, a dielectric 35 and a decorative layer 36. The second metallization 32 bears directly the electronic means (not shown on FIG. 2) necessary for the proper operation of the pick-up as well as the output terminals (not shown on FIG. 2).

The various portions forming the pick-up are now to be described in detail.

Insulating substrate 30 constitutes the base of the pick-up. From the choice of the material utilised and its preparation will depend its capacity to provide the performance which one expects of it, that is to say a good resistance to shocks which may occur during the wearing of the watch. According to the invention, sapphire has been found to be the best material adapted to fulfil this function. In addition to its intrinsic high resistance, sapphire has a further advantage of withstanding the high temperatures necessary for the application of the coatings to which reference will subsequently be made. Glass for instance, in addition to its high brittleness, will soften in the presence of temperatures of the order of 800° C. to 1000° C. The substrate may be obtained by sawing according to a direction such that the C axis of the hexagonal crystal lattice is to be found in the plane of said substrate. It is subsequently subjected to the usual operation of forming (for example rectangular or trapezoidal) and of surface lapping. Through passages 37 are pierced by means of a laser. It is to be noted here that this method is one of the few suitable methods applicable to a material so hard and so thick (on the order of 1 millimeter). It results normally in a diameter $d_1$ of the hole, small (on the order of 0.1 mm) relative to the thickness $d_2$ of the substrate, this being advantageous since it will be subsequently blocked by means of the dielectric 35 as will be explained further on. In a preferred version of the invention the ratio of thickness $d_2$ to the diameter $d_1$ is chosen in a manner such that the relationship $d_2/d_1 > 4$ is satisfied. The substrate then receives a thermal treatment for stabilization thereof, after which the holes are chamfered as shown at 38. Chips which may appear during the piercing of the holes are eliminated by a further lapping operation. Finally the substrate is finely polished on its two major surfaces. It has been found that such polishing is essential for the solidity of the substrate and contributes by suppressing the points of stress concentration represented by scratches to a clear improvement at the shock resistance. In order to obtain the desired performance and according to experience, the average surface roughness following polishing will not exceed 0.05 $\mu$m (optical polish).

Other materials may replace sapphire, insofar as they respond to the criteria of resistance noted above, and the invention may include substrates such as spinel, ruby, quartz and amorphous silica.

Onto the substrate prepared as indicated above, it is possible now to apply the first metallization 101, then the second metallization 32, the metallization 33 of the passage 37 being obtained at the same time as will be seen.

Figure 3:
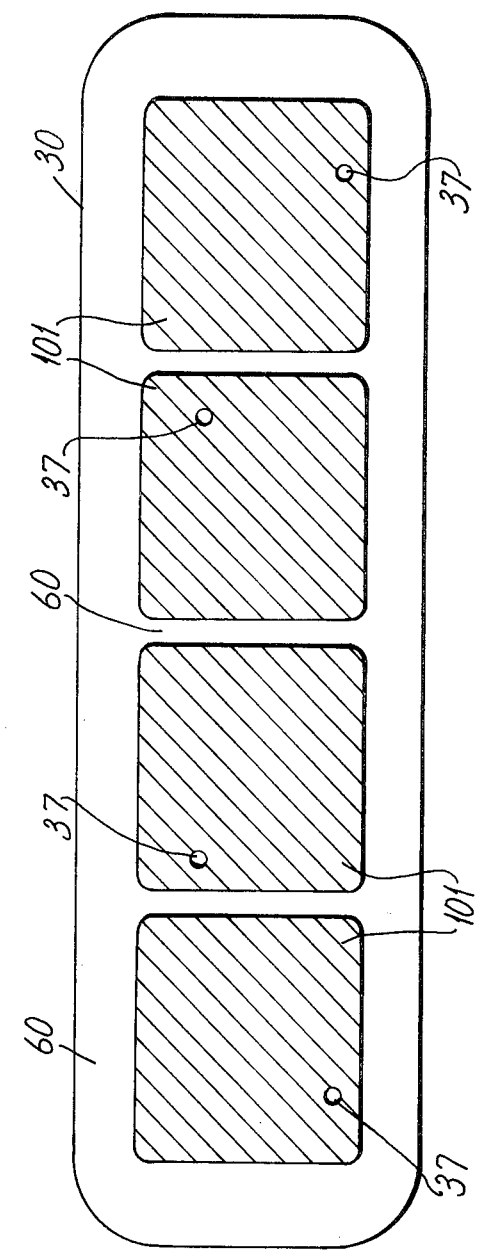
FIG. 3 shows the metallization of the pick-up on the exterior side of the timepiece.

FIG. 3 shows an example of the geometry of the first metallization 101 of the substrate on the outer side of the timepiece. On the outer face of the substrate 30 there is deposited, preferably by silk-screening, a conductive paste which may contain for example a mixture of palladium, platinum and silver. Whatever may be the paste chosen, it is essential that it be well adapted to the successive coating operations which are to be described, and above all that it should develop an excellent adherence onto the polished surface of the substrate. The paste known in commerce under the denomination EMCA 7157 A is well adapted to satisfy these requirements. The geometry of this deposit comprises four electrodes of a square form 101. During the application of the paste, aspiration will be applied to the passages 37 from the surface opposite to that of the figure, and this added to the natural phenomenon of the capillarity will assist in causing the paste to penetrate the interior of the passages and to form the metallization 33 along at least half the length of the latter. Then the thick film thus deposited is baked in an oven at a temperature comprising between 800° C. and 1000° C. The slik-screen and the consistence of the paste are chosen in a manner such that the thickness of the metallization following baking should be comprised between 5 and 15 $\mu$m.

Figure 4:
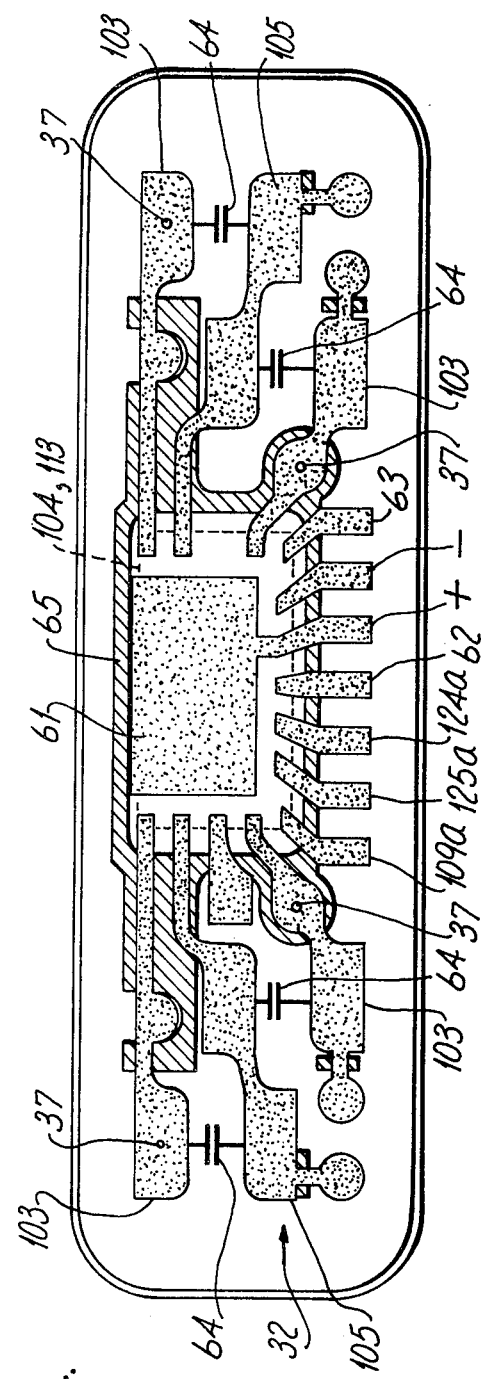
FIG. 4 shows the metallization of the pick-up on the interior portion of the timepiece.

The FIG. 4 shows an example of the geometry of the second metallization 32 of the substrate, on the interior of the timepiece. The deposit is effected as in the case of the deposit of the electrodes by silk-screening according to the same preferred requirements of the paste composition, the baking temperature and the thickness of the metallization following baking. During application of the paste the same aspiration will be applied through holes 37 but from the outer side of the substrate this time, in order to assure the electrical continuity between the two metallic layers. The configuration of the second metallization such as it appears in FIG. 4 shows various conductors capable of receiving electronic means suitable for detecting the position of a finger on the pick-up as well as the input and output terminals of the pick-up. The description will subsequently refer to this special arrangement.

The first and second metallizations are not to be considered as limited to a silk-screening process; other known means may be utilised as for instance the depositing of thin films under vacuum. The essential requirement, for at least the second metallization, is that the thickness of the conductors be compatible with the connection by ultrasonic means of gold or aluminium wires (bonding) with tin lead solder and with gluing by means of a conductive epoxy glue.

If reference is again made to FIG. 3 it will be seen that free spaces 60 are to be found between the electrodes 101. Should one wish that the surface of the finished pick-up be absolutely plane, it is necessary to fill in these spaces by means of a compensation layer 34 which is visible in the cross-section of FIG. 2. This electrically insulating layer 34 will be applied by silk-screening and baked in the oven at a temperature between 800° C. and 1000° C. Its thickness following baking should be the same as that of the electrodes, that is to say between 5 and 15 $\mu$m. It is to be noted that the compensation layer may very well be applied before the metallization 101. As in the case of the metallization layer, the compensation layer should provide excellent adherence to the polished substrate. The paste known in the art under the denomination EMCA 2828 B will be satisfactory in this respect.

FIG. 2 also shows that the metallization 101 and the compensation layer 34 are covered over by a dielectric 35. This deposit is obtained through silk-screening of an insulating paste in at least two stages. Besides the requirement that this layer must present a suitable relative dielectric constant $\epsilon r$ of a value between 8 and 16, it must additionally assure a perfect sealing between the front and back face of the pick-up. This first operation will block the four metallized holes 37 at the same time as it covers the entire front face. Following drying at about 125° C., there will be microscopic pores which will be covered over during the second operation with the purpose of protecting the electrodes against humidity and to assure perfect blocking of the metallized holes. With both layers applied, the assembly will be baked in the oven at a temperature between 800° C. and 1000° C. The thickness of the dielectric following baking will be preferably between 20 and 100 $\mu$m. The dielectric must also exhibit good adherence to the layers on which it is deposited. A similar paste to that used for the compensation layer may satisfy this requirement.

In the place of silk-screening the dielectric, it may be possible to utilise a thin layer of sapphire, glass or ceramic which could be applied to the substrat and the metallization by gluing or other suitable process.

In order to give a suitable aesthetic aspect to the visible surface of the pick-up, FIG. 2 shows finally that the dielectric layer 35 which has just been described is covered over in its turn by a decorative layer 36. As in the case of the other layers, this may also be applied by silk-screening. It will comprise preferably a porcelain enamel the baking of which will be undertaken at a temperature between 770° C. and 850° C. This type of enamel, much more resistant than baked painting (300° C.) or glass enamel (<620° C.), is very hard and can well resist abrasion. Such qualities require the choice of a substrate resistant to high temperatures (sapphire) as already mentioned above.

The decorative layer may be applied in a single operation (one colour) or in several operations (two or more colours). An example of decoration in two colours is shown in FIG. 1 where one may note at 40 a white colour and 41 a black decorative motif. This may comprise a long line enclosed within a sign − and a sign + which is to signify that the group of digits to be corrected will diminish in value if the finger is moved towards the − sign, or increase in value if the finger is moved towards the + sign.

It must be mentioned that the decorative layer 36 also acts as a dielectric layer since it is applied over the main dielectric layer 35. It is thus important that its thickness following baking (5 to 20 μm about), its relative dielectric constant εr (comprised between 6.5 and 13) and its electrical insulating properties be properly chosen in order not to spoil the capacitive effect obtained by the main dielectric.

One now has a static pick-up which comprises, in accordance with the preferred version of the invention, four electrodes having capacitive effect. If the watch user touches with a finger the decorative layer 36 in the zone of an electrode 101, the capacity of the condenser formed with the mass of the metallic case is altered, the finger forming part of the supporting body being separated from the electrode 101 by the dielectric constituted by the layers 35 and 36. It is possible to utilise this variation in capacity in order to produce a control signal when the upper face of the pick-up is touched by the finger and thus to obtain a capacitive pick-up based on this effect. As is described in detail in Swiss Pat. No. 607,872, this capacitive pick-up is arranged in series with a condenser or fixed injective capacity 64 in order to form a capacitive divider connected on the one hand to the earth (support formed by the finger) on the other hand to a terminal 105 of an AC generator delivering for instance a signal at 32 kHz. Thus, the voltage at the junction point of electrode 101 to a support 103 of the injective condenser 64 is representative of the fact that the electrode 101 has or has not been subjected to an order.

According to the invention, the second metallization 32 serves as conductors in order to support directly the electronic means to detect the position of the finger on the pick-up and the input and output terminals of the said pick-up. The said electronic means are described in FIG. 3 of the above cited U.S. application Ser. No. 217,079. The transcoder 104 and assembly 113 of this figure are assembled into a single integrated circuit which is located as shown in FIG. 4 of the present invention. The body of the circiut is glued by means of a conductive glue onto the field 61, itself coupled to the terminal +. The output of the circuit giving the sense of movement of the finger is coupled to the terminal 109a and the outputs slow and fast intended to act on the one or the other group of the display, according to whether the finger is moved rapidly or slowly over the pick-up, are coupled to terminals 125a and 124a respectively. Terminal 62 is activated by a single touch of the finger on the pick-up and enables for instance to reset to zero the seconds or to stop an alarm signal. The terminal − is the negative feed entry and the terminal 63 the input of the signal at 32 kHz. As has been already seen, electrodes 101 (shown in FIG. 3) are electrically coupled to conductors 103 by the metallized passages 37. These conductors 103 are the same as those which are shown under the same reference in FIG. 3 of the cited patent application. The fixed injection condensers 64, mentioned above, as well as the conductors 103 and 105 are coupled to the integrated circuit as shown on FIG. 4. The terminals of the injection condensers 64 may be soldered or welded by means of an epoxy conductive glue to conductors 103, 105 with metallization 32 serving at the same time as a support and a fastening for these condensers. These condensers may be discrete components, but it would be possible to integrate them entirely or partially according to known procedures into the circuit 104, 113.

The integrated circuit 104, 113 is coupled by bonding to the various conductors which surround it. Once this operation is terminated it will be encapsulated according to known techniques. In order to limit the encapsulation zone and thus to avoid that the matter is applied to undesired places, a frame 65 of considerable thickness (40 to 200 μm) may be deposited onto the second metallization by silk-screening or by any other suitable technique.

Figure 5:
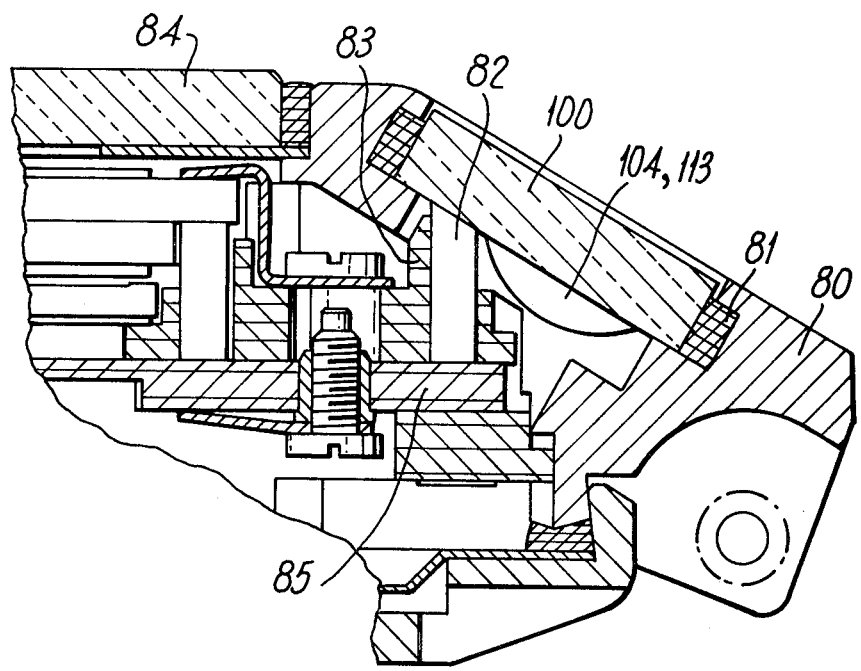
FIG. 5 is a partial cross-section to an enlarged scale according to line B—B of FIG. 1 and which shows how the pick-up is incorporated into the timepiece.

FIG. 5 is a partial cross-section to an enlarged scale according to line B—B of FIG. 1. It shows how the pick-up is incorporated into the timepiece. In the example shown the pick-up is force fitted into the case-band 80 in the same manner as the watch crystal by means of a seal 81. Under the pick-up one may see the encapsulated circuit 104, 113. Conductors 109a, 124a, 125a, 62, +, −, 63 shown in FIG. 4 are coupled to utilisation and display circuits 85 of the watch by means of a multiple flexible conductor 82 of the "zebra" type which the sleeve 83 prevents from bending.

In the example as illustrated in FIG. 5, the pick-up is totally separated from the watch crystal 84. The present invention is not limited to this arrangement. Effectively, if the crystal is of the sapphire type (thus responding to the requirements imposed by the pick-up according to the invention) one might utilise a second zone of this crystal outside the first (which would normally cover the display) in order to obtain the pick-up described herein. Whatever may be the realisation, it will be seen that the capacitive pick-up is sealed as a crystal, and thus may resist shocks and mechanical, physical and chemical stresses which may normally be present in the environment of a wrist-watch. It is seen also that the pick-up constitutes a compact unit which may be realised in mass production, individually inspected, then easily mounted into the case-band of the watch.

What we claim is:

1. A static pick-up for a timepiece comprising at least two juxtaposed touch sensitive capacitive electrodes arranged to be manually actuated and electronic means arranged and adapted to detect each position of a finger which corresponds to at least one symbol in the form of a digit, a letter or special sign, the arrangement being fashioned as a compact unit including an electrically insulating shock resistant substrate bearing on its upper surface a first metallization serving as electrodes and on its lower surface a second metallization serving as conductors arranged to bear said electronic means and input and output terminals of the pick-up, said first and second metallizations being intercoupled by electric coupling means, said electric coupling means between said first and second metallizations being comprised by metallized passages, said electrodes being covered by a dielectric, said dielectric in turn being covered by at least one abrasion resistant decorative layer.

2. A static pick-up as set forth in claim 1 wherein the substrate includes a first zone without metallization arranged to cover a timepiece display and serving as an ordinary watch crystal and a second zone situated outside the first zone so as to form the pick-up, the substrate being mounted in a timepiece case by a force fitted sleeve.

3. A static pick-up as set forth in claim 1 which is independent from a timepiece crystal and which is mounted in a timepiece case in a manner similar to that employed to mount said crystal.

4. A static pick-up as set forth in claim 1 wherein the substrate is formed from a sapphire of which the C axis of the hexagonal crystal lattice lies in the plane of the substrate.

5. A static pick-up as set forth in claim 1 wherein the substrate is formed from a spinel.

6. A static pick-up as set forth in claim 1 wherein the substrate is formed from a ruby.

7. A static pick-up as set forth in claim 1 wherein the substrate is formed from quartz.

8. A static pick-up as set forth in claim 1 wherein the substrate is formed from amorphous silica.

9. A static pick-up as set forth in claim 1 wherein the ratio of the thickness of the substrate $d_2$ to the diameter of the passage prior to metallization $d_1$ satisfies the relationship $(d_2/d_1) > 4$.

10. A static pick-up as set forth in claim 1 wherein a compensating layer is arranged between the surface portions free of metallization of the upper surface of the substrate and the dielectric.

11. A static pick-up as set forth in claim 1 wherein the dielectric exhibits a relative dielectric constant $\epsilon r$ between 8 and 16.

12. A static pick-up as set forth in claim 1 wherein the decorative layer is formed by a porcelain enamel having a relative dielectric constant $\epsilon r$ between 6.5 and 13.

13. A static pick-up as set forth in claim 1 wherein the input and output terminals are coupled to a timepiece main circuit by means of a flexible multiple connector.

* * * * *